(12) United States Patent
Terada et al.

(10) Patent No.: US 10,312,113 B2
(45) Date of Patent: Jun. 4, 2019

(54) FLOW PASSAGE STRUCTURE, INTAKE AND EXHAUST MEMBER, AND PROCESSING APPARATUS

(71) Applicant: KABUSHIKI KAISHA TOSHIBA, Minato-ku (JP)

(72) Inventors: Takahiro Terada, Yokohama (JP); Masayuki Tanaka, Yokohama (JP); Shiguma Kato, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 18 days.

(21) Appl. No.: 15/124,323

(22) PCT Filed: Sep. 10, 2015

(86) PCT No.: PCT/JP2015/075735
§ 371 (c)(1),
(2) Date: Sep. 7, 2016

(87) PCT Pub. No.: WO2016/147442
PCT Pub. Date: Sep. 22, 2016

(65) Prior Publication Data
US 2017/0372923 A1    Dec. 28, 2017

(30) Foreign Application Priority Data

Mar. 18, 2015    (JP) ................................. 2015-055045

(51) Int. Cl.
*F17D 1/00*    (2006.01)
*H01L 21/67*    (2006.01)
(Continued)

(52) U.S. Cl.
CPC ........ *H01L 21/67017* (2013.01); *B33Y 80/00* (2014.12); *F17D 1/00* (2013.01);
(Continued)

(58) Field of Classification Search
CPC ...... Y10T 137/87249; H01L 21/67017; B33Y 80/00; C23C 16/4412; C23C 16/45565; C30B 25/14
(Continued)

(56) References Cited

U.S. PATENT DOCUMENTS

| 1,409,259 | A | * | 3/1922 | Sykora | ................ | B01F 15/0264 |
| | | | | | | 239/562 |
| 4,196,748 | A | * | 4/1980 | Gillespie | ................ | B65G 45/02 |
| | | | | | | 137/565.26 |

(Continued)

FOREIGN PATENT DOCUMENTS

| JP | 2000-98319 A | 4/2000 |
| JP | 2001-33000 A | 2/2001 |

(Continued)

OTHER PUBLICATIONS

International Search Report dated Nov. 24, 2015 in PCT/JP2015/075735 filed Sep. 10, 2015 (with Translation of Category of Cited Documents in attached foreign language Search Report).
(Continued)

*Primary Examiner* — Jessica Cahill
(74) *Attorney, Agent, or Firm* — Oblon, McClelland, Maier & Neustadt, L.L.P.

(57) ABSTRACT

A flow passage structure includes a member. The member includes a plurality of first openings, a plurality of second openings, a flow passage, and a plurality of joining and branching parts. The flow passage connects the first openings with the second openings. The joining and branching parts are provided in the flow passage and each have a plurality of first parts having respective first ends connected with each other and a plurality of second parts having respective second ends connected with each other. The second parts are closer to the second openings than the first parts are, in a path between the first opening and the second
(Continued)

opening. The first ends are connected with the second ends in each joining and branching part.

19 Claims, 4 Drawing Sheets

(51) Int. Cl.
*F17D 1/04* (2006.01)
*B33Y 80/00* (2015.01)
*C23C 16/44* (2006.01)

(52) U.S. Cl.
CPC ............ *F17D 1/04* (2013.01); *H01L 21/6719* (2013.01); *C23C 16/4412* (2013.01)

(58) Field of Classification Search
USPC ............... 239/548, 565, 556; 4/541.3, 541.4, 4/514.5, 514.6
See application file for complete search history.

(56) References Cited

U.S. PATENT DOCUMENTS

| | | | | |
|---|---|---|---|---|
| 4,550,681 | A * | 11/1985 | Zimmer | B05C 5/0254 101/120 |
| 5,595,606 | A * | 1/1997 | Fujikawa | C23C 16/45561 118/715 |
| 6,086,677 | A * | 7/2000 | Umotoy | C23C 16/45514 118/715 |
| 6,502,530 | B1 * | 1/2003 | Turlot | C23C 16/455 118/723 E |
| 7,611,585 | B2 | 11/2009 | Choi | |
| 9,803,282 | B2 * | 10/2017 | Yamada | C23C 16/52 |
| 2001/0021414 | A1 * | 9/2001 | Morishima | C23C 16/4404 427/248.1 |
| 2001/0021417 | A1 * | 9/2001 | Child | B60R 21/235 427/385.5 |
| 2002/0092281 | A1 | 7/2002 | Choi et al. | |
| 2002/0121239 | A1 * | 9/2002 | Tonazzi | B05C 5/0254 118/401 |
| 2009/0104351 | A1 * | 4/2009 | Kakegawa | C23C 16/34 427/248.1 |
| 2009/0169744 | A1 * | 7/2009 | Byun | C23C 16/40 427/255.28 |
| 2009/0320754 | A1 | 12/2009 | Oya et al. | |
| 2010/0307416 | A1 * | 12/2010 | Park | C23C 16/4405 118/724 |
| 2012/0067971 | A1 * | 3/2012 | Byun | C23C 16/45565 239/106 |
| 2012/0227848 | A1 | 9/2012 | Oya et al. | |
| 2014/0209015 | A1 | 7/2014 | Yamada et al. | |
| 2014/0283746 | A1 * | 9/2014 | Seo | C23C 16/505 118/723 R |
| 2014/0373783 | A1 * | 12/2014 | Sawada | H01L 31/1824 118/723 R |
| 2016/0053374 | A1 * | 2/2016 | Hwang | C23C 16/45559 118/728 |
| 2017/0268711 | A1 * | 9/2017 | Tanaka | F16L 55/027 |

FOREIGN PATENT DOCUMENTS

| | | |
|---|---|---|
| JP | 2006-131985 A | 5/2006 |
| JP | 2009-277730 A | 11/2009 |
| JP | 2010-108459 A | 5/2010 |
| JP | 2014-12239 | 1/2014 |
| WO | WO 2006/090537 A1 | 8/2006 |
| WO | 2008/023711 A1 | 2/2008 |
| WO | WO 2013/136656 A1 | 9/2013 |

OTHER PUBLICATIONS

Taiwanese Office Action dated Apr. 11, 2016 in Taiwanese Application No. 104129991 (with English translation).

* cited by examiner

FLOW PASSAGE STRUCTURE, INTAKE AND EXHAUST MEMBER, AND PROCESSING APPARATUS

CROSS-REFERENCE TO RELATED APPLICATIONS

This application is national stage application of International Application No. PCT/JP2015/075735, filed Sep. 10, 2015, which designates the United States, incorporated herein by reference, and which is based upon and claims the benefit of priority from Japanese Patent Application No. 2015-055045, filed Mar. 18, 2015, the entire contents of which are incorporated herein by reference.

FIELD

Embodiments described herein relate generally to a flow passage structure, an intake and exhaust member, and a processing apparatus.

BACKGROUND

For example, in an apparatus that sucks or ejects fluid from a plurality of openings, a member configured to suck or eject fluid evenly from the openings is known. For example, a flow passage in communication with the openings branches multiple times so that fluid is sucked or ejected evenly from the openings.

CITATION LIST

Patent Literature

Patent Literature 1: Japanese Patent Application Laid-open No. 2006-131985

SUMMARY OF THE INVENTION

Problem to be Solved by the Invention

When a flow passage branches multiple times, a pressure loss tends to occur in fluid.

DETAILED DESCRIPTION

According to one embodiment, a flow passage structure includes a member. The member is provided with a plurality of first openings, a plurality of second openings, a flow passage and a plurality of joining and branching parts. The flow passage connects the first openings with the second openings. The joining and branching parts are provided in the flow passage, the joining and branching parts each including a plurality of first parts having respective first ends connected with each other and a plurality of second parts having respective second ends connected with each other, the second parts being closer to the second openings than the first parts are, in a path between the first opening and the second opening, the first ends being connected with the second ends in each joining and branching part.

Referring FIG. 1 to FIG. 3, a first embodiment will be described below. A plurality of expressions may be used for components according to embodiments and a description of the pertinent elements. It is inevitable that any other expressions not provided herein are made for the components and the description. It is also inevitable that any other expressions are made for components and description not provided with a plurality of expressions.

Figure 1:
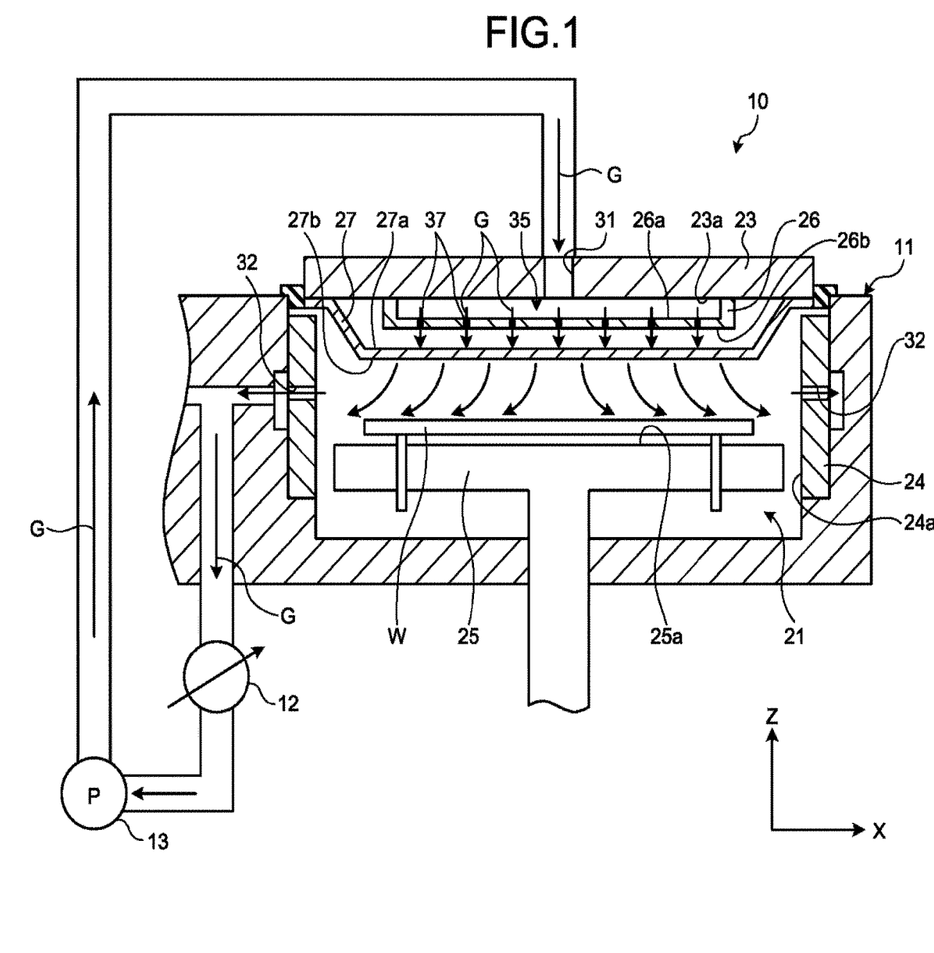
FIG. 1 is a cross-sectional view schematically illustrating a semiconductor manufacturing apparatus according to a first embodiment.

FIG. 1 is a cross-sectional view schematically illustrating a semiconductor manufacturing apparatus 10 according to a first embodiment. The semiconductor manufacturing apparatus 10 is an example of the processing apparatus and may be referred to as, for example, a manufacturing apparatus, an intake and exhaust apparatus, a supply apparatus, or an apparatus. The processing apparatus is not limited to the semiconductor manufacturing apparatus 10 but may be other apparatuses that perform processing, for example, such as work, cleaning, and test on an object of interest.

As illustrated in the drawings, in the present description, the X-axis, the Y-axis, and the Z-axis are defined. The X-axis, the Y-axis, and the Z-axis are orthogonal to each other. The X-axis extends along the width of the semiconductor manufacturing apparatus 10. The Y-axis extends along the depth (length) of the semiconductor manufacturing apparatus 10. The Z-axis extends along the height of the semiconductor manufacturing apparatus 10.

As illustrated in FIG. 1, the semiconductor manufacturing apparatus 10 has a manufacturing unit 11, a pressure gauge 12, and a pump 13. The pump 13 may be referred to as, for example, a supply unit, a discharging unit, or a feeder. The manufacturing unit 11 includes a chamber 21. The semiconductor manufacturing apparatus 10 manufactures, for example, semiconductor wafers (hereinafter referred to as wafers) W in the chamber 21.

The manufacturing unit 11 has a top wall 23, a surrounding wall 24, a stage 25, a diffusion plate 26, and a shower plate 27. The stage 25 is an example of the processing unit and may be referred to as, for example, a rest or a base. The diffusion plate 26 is an example of the feeder and may be referred to as, for example, a supply unit, a discharging unit, or a unit. The shower plate 27 is an example of the flow passage structure, the intake and exhaust member, and the member, and may be referred to as, for example, a branching unit, an ejecting unit, a discharging unit, a sucking unit, or a component.

The top wall 23 has a first inner surface 23a. The first inner surface 23a is a substantially flat surface facing down. The first inner surface 23a forms a part of the chamber 21. That is, the first inner surface 23a faces the inside of the chamber 21.

The top wall 23 has a supply port 31. The supply port 31 is connected to the pump 13, for example, through a pipe. The pump 13 supplies gas G to the chamber 21 through the supply port 31. Gas G is an example of fluid. FIG. 1 illustrates the flow of gas G by arrows.

The surrounding wall 24 has a second inner surface 24a. The second inner surface 24a is a surface oriented substantially horizontally. The second inner surface 24a forms a part of the chamber 21. That is, the second inner surface 24a faces the inside of the chamber 21.

The surrounding wall 24 has a plurality of exhaust ports 32. The exhaust port 32 is connected to the pump 13 through the pressure gauge 12. The pump 13 can suck gas G in the chamber 21 through the exhaust port 32. In other words, gas G in the chamber 21 is discharged from the exhaust port 32.

The stage 25 is disposed in the inside of the chamber 21. The stage 25 has a support 25a. The support 25a faces the first inner surface 23a of the top wall 23 and supports a wafer W. The stage 25 has a heater to heat a wafer W supported on the support 25a.

The diffusion plate 26 is disposed in the inside of the chamber 21 and is attached to the top wall 23. The diffusion plate 26 has a first surface 26a and a second surface 26b. The first surface 26a is opposed to the first inner surface 23a of the top wall 23. The second surface 26b is positioned on the opposite side to the first surface 26a.

A diffusion room 35 is formed between the diffusion plate 26 and the top wall 23 The diffusion room 35 is a space surrounded by the diffusion plate 26 and the top wall 23. The diffusion room 35 is in communication with the supply port 31 of the top wall. This configuration allows the gas G to be supplied to the diffusion room 35 through the supply port 31.

The diffusion plate 26 has a plurality of holes 37. The hole 37 is a hole connecting the first surface 26a with the second surface 26b. That is, the hole 37 connects the inside with the outside of the diffusion room 35.

The shower plate 27 is disposed in the inside of the chamber 21 and attached to the top wall 23. The shower plate 27 covers the diffusion plate 26. In other words, the diffusion plate 26 is disposed between the shower plate 27 and the top wall 23.

The shower plate 27 has a third surface 27a and a fourth surface 27b. The third surface 27a is opposed to the second surface 26b of the diffusion plate 26. The third surface 27a faces a plurality of holes 37 formed in the second surface 26b. The fourth surface 27b is positioned on the opposite side to the third surface 27a. The fourth surface 27b faces a wafer W supported on the support 25a of the stage 25.

Figure 2:
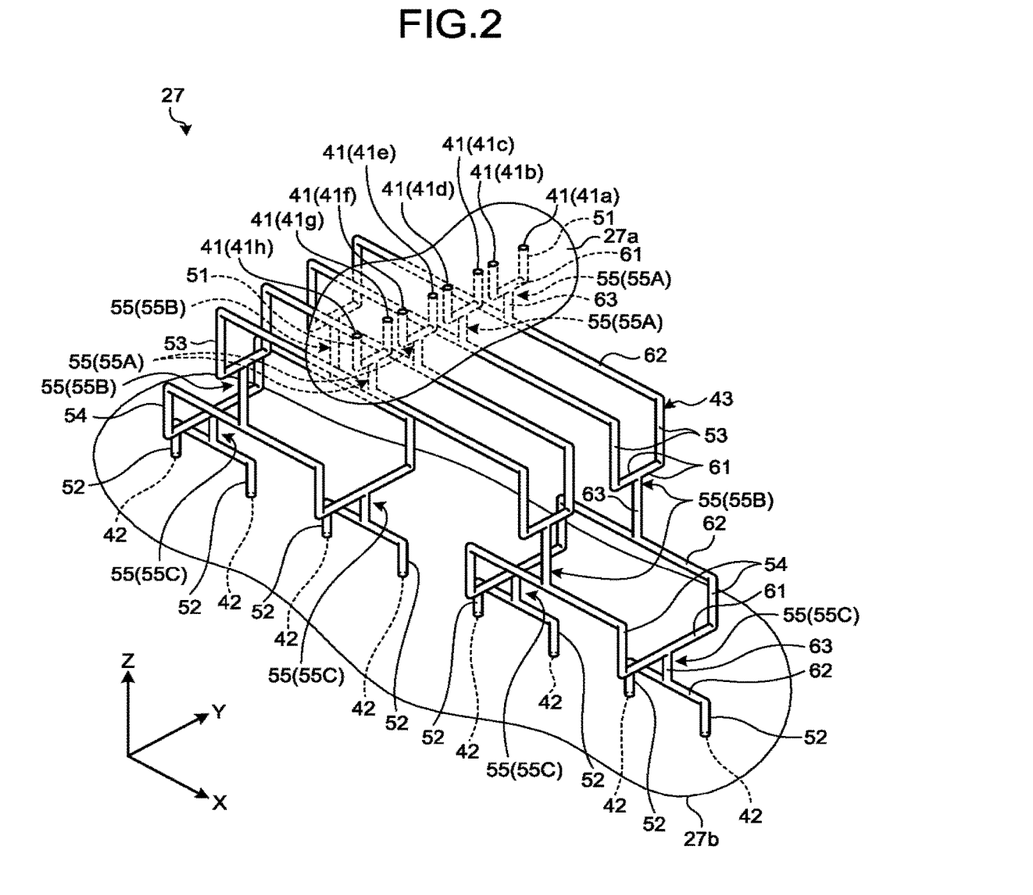
FIG. 2 is a perspective view schematically illustrating a shower plate in the first embodiment.

FIG. 2 is a perspective view schematically illustrating the shower plate 27 in the first embodiment. As illustrated in FIG. 2, the shower plate 27 includes a plurality of first openings 41, a plurality of second openings 42, and a flow passage 43. The first and second openings 41 and 42 may be referred to as, for example, intake ports, exhaust ports, vent holes, openings, inlets, outlets, or holes. The flow passage 43 may be referred to as, for example, a duct, piping, or a passage.

For the sake of explanation, FIG. 2 does not illustrate the inside of the shower plate 27 but illustrates a part of the third surface 27a, a part of the fourth surface 27b, and the flow passage 43 formed in the inside of the shower plate 27. The flow passage 43 is a passage provided in the inside of the solid shower plate 27 to allow fluid to flow. The flow passage 43 is not limited to this configuration.

A plurality of first openings 41 are each formed in the third surface 27a of the shower plate 27. In other words, a plurality of first openings 41 are in communication with the second surface 26b of the diffusion plate 26. The first openings 41 have substantially the same size and shape. The first openings 41 are not limited to this configuration.

A plurality of second openings 42 are each formed in the fourth surface 27b of the shower plate 27. In other words, a plurality of second openings 42 are in communication with the support 25a of the stage 25 and the wafer W supported on the support 25a. The second openings 42 have substantially the same size and shape. The size and shape of each second opening 42 is substantially the same as the size and shape of each first opening 41. The second openings 42 are not limited to this configuration.

The flow passage 43 connects a plurality of first openings 41 with a plurality of second openings 42. That is, a plurality of first openings 41 and a plurality of second openings 42 are connected with each other through the single flow passage 43. In other words, the single flow passage 43 connects each first opening 41 with all of the second openings 42 and connects each second opening 42 with all of the first openings 41. The flow passage 43 is not limited to this configuration.

The flow passage 43 has a plurality of first connecting passages 51, a plurality of second connecting passages 52, a plurality of third connecting passages 53, a plurality of fourth connecting passages 54, and a plurality of joining and branching parts 55. The joining and branching part 55 may be referred to as, for example, an intersection, a mixing part, a coupling part, or a part.

A plurality of first connecting passages 51, a plurality of second connecting passages 52, a plurality of third connecting passages 53, a plurality of fourth connecting passages 54, and a plurality of joining and branching parts 55 form the flow passage 43. The flow passage 43 may have any other parts.

As illustrated in FIG. 2, three joining and branching parts 55 are provided in each path between the first opening 41 and each second opening 42 in the flow passage 43. In other words, a path from the first opening 41 to each second opening 42 in the flow passage 43 passes through three joining and branching parts 55. That is, the number of joining and branching parts 55 provided in each of the paths between the first openings 41 and each second opening 42 in the flow passage 43 is equal.

The joining and branching part 55 merges or divides a path between the first opening 41 and each second opening 42 in the flow passage 43. Each path between the first opening 41 and each second opening 42 in the flow passage 43 branches in three stages.

In the following description, the joining and branching part 55 at the first stage of the path from the first opening 41 to each second opening 42 in the flow passage 43 may be referred to as a joining and branching part 55A, the joining and branching part 55 at the second stage may be referred to as a joining and branching part 55B, and the joining and branching part 55 at the third stage may be referred to as a joining and branching part 55C, individually. That is, the joining and branching part 55A is closer to the first opening 41 than the joining and branching part 55B is, in the path between the first opening 41 and each second opening 42 in the flow passage 43. The joining and branching part 55C is closer to the second opening 42 than the joining and branching part 55B is, in the path between the first opening 41 and each second opening 42 in the flow passage 43.

Figure 3:
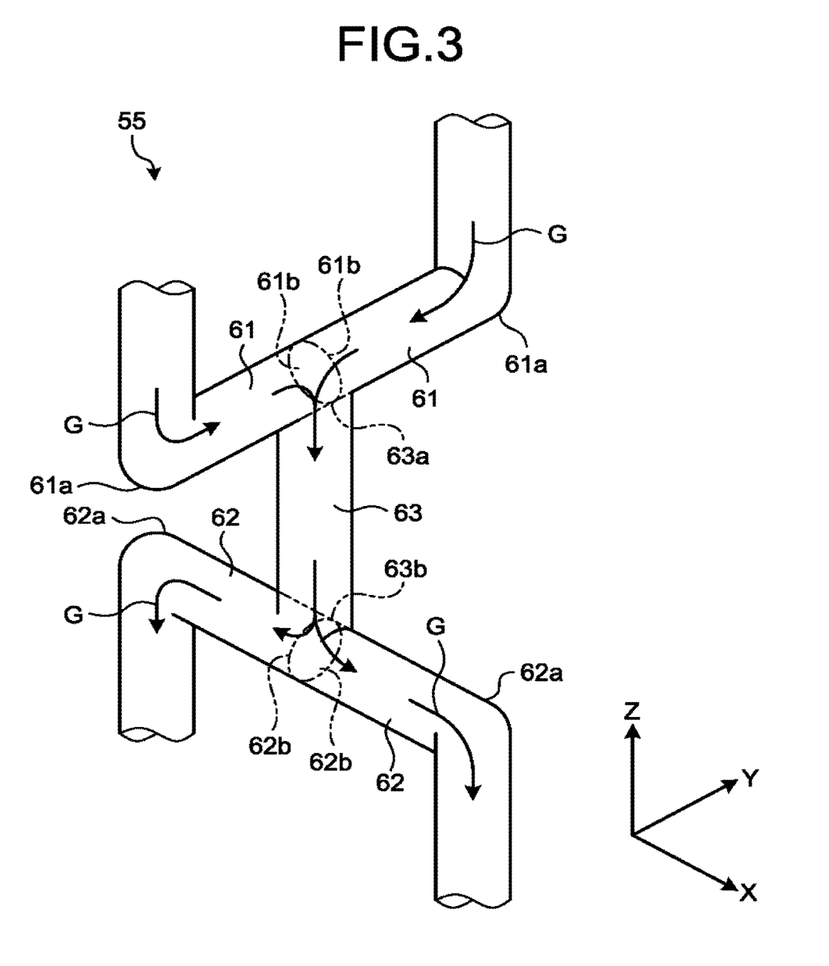
FIG. 3 is a perspective view schematically illustrating one of joining and branching parts in the first embodiment.

FIG. 3 is a perspective view schematically illustrating one of the joining and branching parts 55 in the first embodiment. As illustrated in FIG. 3, each of the joining and branching parts 55 has two first parts 61, two second parts 62, and a connecting part 63. The first and second parts 61 and 62 may be referred to as, for example, flow passages or passages.

The first part 61 is a part of the joining and branching part 55 that is closer to the first opening 41 than the second part 62 is, in the path between the first opening 41 and each second opening 42 in the flow passage 43. In the present embodiment, the first part 61 extends in a direction along the Y-axis.

The joining and branching part 55 may have three or more first parts 61. The first part 61 may extend in a direction different from the direction along the Y-axis. For example, three or more first parts 61 may extend radially. Alternatively, the first part 61 may extend in the shape of a curved line.

The first parts 61 each have a first outer end 61a and a first coupling end 61b. The first coupling end 61b is an example of the first end and may be referred to as, for example, a coupling part, a connecting part, or a joint part.

The first outer end 61a is one end of the first part 61 that is closer to the first opening 41 than the first coupling end 61b is, in the path between the first opening 41 and each second opening 42 in the flow passage 43.

The first coupling end 61b is positioned on the opposite side to the first outer end 61a. That is, the first coupling end 61b is one end of the first part 61 that is closer to the second opening 42 than the first outer end 61a is, in the path between the first opening 41 and each second opening 42 in the flow passage 43.

The first coupling ends 61b of the two first parts 61 are connected with each other. In other words, the two first parts 61 are connected with each other at the first coupling ends 61b. The two first parts 61 in the present embodiment are connected in the shape of a straight line but may be connected, for example, so as to intersect with each other.

The second part 62 is a part of the joining and branching part 55 that is closer to the second opening 42 than the first part 61 is, in the path between the first opening 41 and each second opening 42 in the flow passage 43. In present embodiment, the second part 62 extends in a direction along the X-axis.

The joining and branching part 55 may have three or more second parts 62. The second part 62 may extend in a direction different from the direction along the X-axis. For example, three or more second parts 62 may extend radially. The second part 62 may extend in the shape of a curved line.

The second parts 62 each have a second outer end 62a and a second coupling end 62b. The second coupling end 62b is an example of the second end and may be referred to as, for example, a coupling part, a connecting part, or a joint part.

The second outer end 62a is one end of the second part 62 that is closer to the second opening 42 than the second coupling end 62b is, in the path between the first opening 41 and each second opening 42 in the flow passage 43.

The second coupling end 62b is positioned on the opposite side to the second outer end 62a. That is, the second coupling end 62b is one end of the second part 62 that is closer to the first opening 41 than the second outer end 62a is, in the path between the first opening 41 and each second opening 42 in the flow passage 43.

The second coupling ends 62b of the two second parts 62 are connected with each other. In other words, the two second parts 62 are connected with each other at the second coupling ends 62b. The two second parts 62 in the present embodiment are connected in the shape of a straight line but may be connected, for example, so as to intersect with each other.

The connecting part 63 is a part of the joining and branching part 55 that extends between the first part 61 and the second opening 42 in the path between the first opening 41 and each second opening 42 in the flow passage 43. In the present embodiment, the connecting part 63 extends in a direction along the Z-axis.

Two or more connecting parts 63 may be provided. The connecting part 63 may extend in a direction different from the direction along the Z-axis. The connecting part 63 may extend in the shape of a curved line.

The connecting part 63 has a third coupling end 63a and a fourth coupling end 63b. The third and fourth coupling ends 63a and 63b may be referred to as, for example, coupling parts, connecting parts, or joint parts.

The third coupling end 63a is one end of the connecting part 63 that is closer to the first opening 41 than the fourth coupling end 63b is, in the path between the first opening 41 and each second opening 42 in the flow passage 43.

The fourth coupling end 63b, is positioned on the opposite side to the third coupling end 63a. That is, the fourth coupling end 63b is one end of the connecting part 63 that is closer to the second opening 42 than the third coupling end 63a is, in the path between the first opening 41 and each second opening 42 in the flow passage 43.

The third coupling end 63a is connected to the first coupling ends 61b of the two first parts 61 coupled to each other. Each first part 61 thus extends in a direction along the Y-axis from the first coupling end 61b connected to the third coupling end 63a.

The fourth coupling end 63b is connected to the second coupling ends 62b of the two second parts 62 coupled to each other. Each second part 62 thus extends in a direction along the X-axis from the second coupling end 62b connected to the fourth coupling end 63b.

The connecting part 63 connects the first coupling ends 61b of the two first parts 61 coupled to each other, with the second coupling ends 62b of the two second parts 62 coupled to each other. That is, the first coupling end 61b of each of the two first parts 61 and the second coupling end 62b of each of the two second parts 62 are connected by the connecting part 63.

A plurality of joining and branching parts 55A, a plurality of joining and branching parts 55B, and a plurality of joining and branching parts 55C illustrated in FIG. 2 each include two first parts 61, two second parts 62, and a connecting part 63 as described above.

The shapes and sizes of the first part 61, the second part 62, and the connecting part 63 are substantially the same in a plurality of joining and branching parts 55A. However, the shapes and sizes of the first part 61, the second part 62, and the connecting part 63 in the joining and branching part 55A may be different from the shapes and sizes of the first part 61, the second part 62, and the connecting part 63 in each of other joining and branching parts 55B and 55C.

The shapes and sizes of the first part 61, the second part 62, and the connecting part 63 are substantially the same in a plurality of joining and branching parts 55B. However, the shapes and sizes of the first part 61, the second part 62, and the connecting part 63 in the joining and branching part 55B may be different from the shapes and sizes of the first part 61, the second part 62, and the connecting part 63 in each of other joining and branching parts 55A and 55C.

The shapes and sizes of the first part 61, the second part 62, and the connecting part 63 are substantially the same in a plurality of joining and branching parts 55C. However, the shapes and sizes of the first part 61, the second part 62, and the connecting part 63 in the joining and branching part 55C may be different from the shapes and sizes of the first part 61, the second part 62, and the connecting part 63 in each of other joining and branching parts 55A and 55B.

As described above, the shapes and sizes of the first part 61, the second part 62, and the connecting part 63 in the joining and branching parts 55 at the same stage are substantially the same. However, the shapes and sizes of the first part 61, the second part 62, and the connecting part 63 in the joining and branching parts 55 at different stages may be different.

As illustrated in FIG. 2, a plurality of first connecting passages 51 each connect the first opening 41 with the first outer end 61a of the first part 61 of the corresponding joining and branching part 55A. The first part 61 of the joining and branching part 55A is thus connected with the first opening 41.

The first connecting passages 51 have substantially the same length. The first connecting passages 51 each extend in a direction along the Z-axis but may extend in any other direction. The first connecting passage 51 may extend in the shape of a curved line.

The second connecting passages 52 each connect the second opening 42 with the second outer end 62a of the second part 62 of the corresponding joining and branching part 55C. The second part 62 of the joining and branching part 55C is thus connected with the second opening 42.

The second connecting passages 52 have substantially the same length. The second connecting passages 52 each extend in a direction along the Z-axis but may extend in any other direction. The second connecting passage 52 may extend in the shape of a curved line.

The third connecting passages 53 each connect the second outer end 62a of the second part 62 of the joining and branching part 55A with the first outer end 61a of the first part 61 of the joining and branching part 55B. The second part 62 of the joining and branching part 55A is thus connected with the first part 61 of the joining and branching part 55B.

The third connecting passages 53 have substantially the same length. The third connecting passages 53 each extend in a direction along the Z-axis but may extend in any other direction. The third connecting passage 53 may extend in the shape of a curved line.

The fourth connecting passages 54 each connect the second outer end 62a of the second part 62 of the joining and branching part 55B with the first outer end 61a of the first part 61 of the joining and branching part 55C. The second part 62 of the joining and branching part 55B is thus connected with the first part 61 of the joining and branching part 55C.

The fourth connecting passages 54 have substantially the same length. The fourth connecting passages 54 each extend in a direction along the Z-axis but may extend in any other direction. The fourth connecting passage 54 may extend in the shape of a curved line.

The cross-sectional shape and the cross-sectional area of the flow passage 43 as described above are constant in the path between the first opening 41 and each second opening 42. For example, the cross-sectional shape of the flow passage 43 is circular. The cross-sectional shape of the flow passage 43 may be any other shape such as rectangle and quadrangle. In the present description, even when the cross-sectional shape and the cross-sectional area of the flow passage 43 slightly change in the path between the first opening 41 and each second opening 42, it is assumed that the cross-sectional shape and the cross-sectional area of the flow passage 43 are constant in the path between the first opening 41 and each second opening 42.

The length of the path between the first opening 41 and each second opening 42 in the flow passage 43 is uniform. In the present description, the length of the path between the first opening 41 and the second opening 42 in the flow passage 43 refers to the length in the center of cross-section of the flow passage 43 in the path from one first opening 41 to one second opening 42. In the present description, even when the length of the path between the first opening 41 and each second opening 42 in the flow passage 43 slightly varies, it is assumed that the length of the path between the first opening 41 and each second opening 42 in the flow passage 43 is uniform.

In the aforementioned semiconductor manufacturing apparatus 10 ejects gas G toward the wafer W on the stage 25, for example, as will be described below. The method by which the semiconductor manufacturing apparatus 10 ejects gas G is not limited to the method described below.

First, the semiconductor manufacturing apparatus 10 actuates the pump 13 illustrated in FIG. 1. The pump 13 sucks gas G in the chamber 21 through the exhaust port 32 and delivers the gas G to the diffusion room 35 through the supply port 31. The pump 13 may deliver, for example, gas G in a tank storing gas G through the supply port 31.

The gas G introduced to the diffusion room 35 is delivered to the shower plate 27 through a plurality of holes 37 in communication with the diffusion room 35. Because of provision of a plurality of holes 37, the diffusion plate 26 delivers gas G in a distributed manner.

The gas G is delivered to the third surface 27a of the shower plate 27 through the holes 37 in the diffusion plate 26. The gas G is introduced into a plurality of first openings 41 formed in the third surface 27a illustrated in FIG. 2. In this way, the diffusion plate 26 is connected to the shower plate 27 in the path in which gas G flows in the semiconductor manufacturing apparatus 10 to introduce gas G to a plurality of first openings 41.

In the following description, a plurality of first openings 41 may be referred to as first openings 41a, 41b, 41c, 41d, 41e, 41f, 41g, and 41h, individually. Gas G introduced from the first opening 41a may be referred to as gas Ga, gas G introduced from the first opening 41b may be referred to as gas Gb, gas G introduced from the first opening 41c may be referred to as gas Gc, gas G introduced from the first opening 41d may he referred to as gas Gd, gas G introduced from the first opening 41e may be referred to as gas Ge, gas G introduced from the first opening 41f may be referred to as gas Gf, gas G introduced from the first opening 41g may be referred to as gas Gg, and gas G introduced from the first opening 41h may be referred to as gas Gh, individually.

Gas G introduced to the first opening 41 flows from the first connecting passage 51 connected to each first opening 41 into the first part 61 of the joining and branching part 55A. The gas G then merges at the first coupling ends 61b of the first parts 61 connected with each other. In this way, the path from the first opening 41 to the second opening 42 in the flow passage 43 merges at the first coupling ends 61b of the first parts 61 of the joining and branching part 55A.

The gas Ga and gas Gb merged at the first coupling ends 61b (hereinafter referred to as gas Gab) flows from the first coupling ends 61b of the first parts 61 into the connecting part 63. Similarly, the gas Gc and gas Gd (hereinafter referred to as gas Gcd), the gas Ge and gas Gf (hereinafter referred to as gas Gef), and the gas Gg and gas Gh (hereinafter referred to as gas Ggh) each merge at the first coupling ends 61b of the first parts 61 to flow into the connecting part 63.

Each gas G branches at the second coupling ends 62b of the second parts 62 connected with each other. In this way, the path from the first opening 41 to the second opening 42 in the flow passage 43 branches at the second coupling ends 62b of the second parts 62 of the joining and branching part 55A. Each gas G (gas Gab, Gcd, Gef, Ggh) branches in a mixed state at the second coupling ends 62b of the second parts 62.

The gas G flows from the third connecting passage 53 connected with each second part 62 of the joining and branching part 55A into the first part 61 of the joining and branching part 55B. The gas G then merges at the first coupling ends 61*b* of the first parts 61 connected with each other. In this way, the path from the first opening 41 to the second opening 42 in the flow passage 43 merges again at the first coupling ends 61*b* of the first parts 61 of the joining and branching part 55B.

The gas Gab and gas Gcd (hereinafter referred to as gas Gabcd) merged at the first coupling ends 61*b* flows from the first coupling ends 61*b* of the first parts 61 into the connecting part 63. Similarly, the gas Gef and the gas Ggh (hereinafter referred to as gas Gefgh) merge at the first coupling ends 61*b* of the first parts 61 to flow into the connecting part 63.

Each gas G branches at the second coupling ends 62*b* of the second parts 62 connected with each other. In this way, the path from the first opening 41 to the second opening 42 in the flow passage 43 branches again at the second coupling ends 62*b* of the second parts 62 of the joining and branching part 55B. Each gas G (gas Gabcd, Gefgh) branches in a mixed state at the second coupling ends 62*b* of the second parts 62.

The gas G flows from the fourth connecting passage 54 connected to each second part 62 of the joining and branching part 55B into the first part 61 of the joining and branching part 55C. The gas G then merges at the first coupling ends 61*b* of the first parts 61 connected with each other. In this way, the path from the first opening 41 to the second opening 42 in the flow passage 43 further merges at the first coupling ends 61*b* of the first parts 61 of the joining and branching part 55C.

The gas Gabcd and gas Gefgh (hereinafter referred to as gas Gabcdefgh) merged at the first coupling ends 61*b* flows from the first coupling ends 61*b* of the first parts 61 into the connecting part 63.

Each gas G branches at the second coupling ends 62*b* of the second parts 62 connected with each other. In this way, the path from the first opening 41 to the second opening 42 in the flow passage 43 further branches at the second coupling ends 62*b* of the second parts 62 of the joining and branching part 55C. Each gas G (gas Gabcdefgh) branches in a mixed state at the second coupling ends 62*b* of the second parts 62.

The gas G flows toward the second opening 42 from the second connecting passage 52 connected to each second part 62 of the joining and branching part 55C. The gas G is ejected from a plurality of second openings 42 toward the wafer W supported on the support 25*a* of the stage 25.

As described above, the respective gasses Ga, Gb, Gc, Gd, Ge, Gf, Gg, and Gh introduced from a plurality of first openings 41*a*, 41*b*, 41*c*, 41*d*, 41*e*, 41*f*, 41*g*, and 41*h* merge and branch multiple times in the flow passage 43. The gas G introduced from all of the first openings 41 is thus mixed into gas Gabcdefgh, which is in turn ejected from a plurality of second openings 42.

The shower plate 27 as described above is formed, for example, by additive manufacturing with a three-dimensional printer. The shower plate 27 is formed of various materials such as synthetic resins and metals. A material resistant to fluid (gas G) supplied by the shower plate 27 is selected as a material of the shower plate 27.

The three-dimensional printer forms the shower plate 27, for example, by repeating formation of a material layer and solidification of the material layer in a direction along the Z-axis. The flow passage 43 may be subjected to cutting during the process of adding the layers to form the shower plate 27. During the process of adding the layers to form the shower plate 27, for example, surfaces of the flow passage 43 other than the surface facing downward may be subjected to cutting.

The shower plate 27 may be formed by a method other than additive manufacturing. For example, the shower plate 27 may be formed by joining together a plurality of members each having a part of the flow passage 43 formed by cutting.

Embodiments are not limited to the shower plate 27. A variety of members having a plurality of first openings 41, a plurality of second openings 42, and a flow passage 43 may be formed by a variety of methods. For example, a plurality of pipes may be connected to form a member having a plurality of first openings 41, a plurality of second openings 42, and a flow passage 43.

In the semiconductor processing apparatus 10 according to the first embodiment, in the flow passage 43 connecting a plurality of first openings 41 with a plurality of second openings 42, a plurality of joining and branching parts 55 are provided in which the mutually connected first coupling ends 61*b* of a plurality of first parts 61 are connected with the mutually connected second coupling ends 62*b* of a plurality of second parts 62. With this configuration, for example, when gas G flows from a plurality of first openings 41 toward a plurality of second openings 42, gas G merges at the first coupling ends 61*b* of a plurality of joining and branching parts 55, and gas branches at the second coupling ends 62*b*. Accordingly, for example, even when the pressure and the flow rate of gas G introduced from the first openings 41 vary, merging and branching of gas G at a plurality of joining and branching part 55 facilitates evenness of the pressure and the flow rate of gas G ejected from the second openings 42. In addition, a pressure loss of gas G in the flow passage 43 is suppressed, because gas G is introduced from a plurality of first openings 41. Accordingly, for example, even when the pressure of gas G that can be supplied by the pump 13 is relatively low, gas G can be emitted at a relatively high pressure from the second openings 42.

The lengths of the paths between a plurality of first openings 41 and each second opening 42 in the flow passage 43 are uniform. This configuration further facilitates, for example, evenness of the pressure and the flow rate of gas G ejected from the second openings 42 through the flow passage 43.

In the flow passage 43 between a plurality of first openings 41 and each second opening 42 in the flow passage 43, a plurality of joining and branching parts 55 are provided. In this configuration, gas G merges and branches multiple times, for example, when gas G flows from a plurality of first openings 41 toward a plurality of second openings 42. This configuration further facilitates evenness of the pressure and the flow rate of gas G ejected from the second openings 42, for example, even when the pressure and the flow rate of gas G introduced from the first openings 41 vary.

The flow passage 43 connects each first opening 41 with all of the second openings 42. In this configuration, for example, when gas G flows from a plurality of first openings 41 toward a plurality of second openings 42, gas G (gas Gabcdefgh) ejected from one second opening 42 includes gas G (gas Ga, Gb, Gc, Gd, Ge, Gf, Gg, Gh) introduced from all of the first openings 41. This configuration further facilitates evenness of the pressure and the flow rate of gas G ejected from the second openings 42, for example, even when the pressure and the flow rate of the gas G introduced from the first openings 41 vary. Even when a part of the flow passage 43 is clogged, gas G passing through other parts of the flow passage 43 is ejected from a plurality of second openings 42. This configuration eliminates or minimizes stop of supply of gas G.

The number of joining and branching parts 55 provided in each of the paths between a plurality of first openings 41 and each second opening 42 in the flow passage 43 is equal. In this configuration, gas G merges and branches at an equal number of times in each path, for example, when gas G flows from a plurality of first openings 41 toward a plurality of second openings 42. This configuration further facilitates evenness of the pressure and the flow rate of gas G ejected from the second openings 42, for example, even when the pressure and the flow rate of gas G introduced from the first openings 41 vary.

In the foregoing first embodiment, the number of first openings 41 is equal to the number of second openings 42. However, the number of first and second openings 41, 42 is not limited to this. For example, the number of second openings 42 may be greater than the number of first openings 41, or the number of first openings 41 may be greater than the number of second openings 42. By setting the number of second openings 42 greater than the number of first openings 41, gas G is ejected from a wider range.

In the foregoing first embodiment, the first coupling ends 61b of the first parts 61 are connected with the second coupling ends 62b of the second parts 62 by the connecting part 63. However, the first coupling ends 61b of a plurality of first parts 61 and the second coupling ends 62b of a plurality of second parts 62 are connected at one place, and the connecting part 63 may be eliminated.

Figure 4:
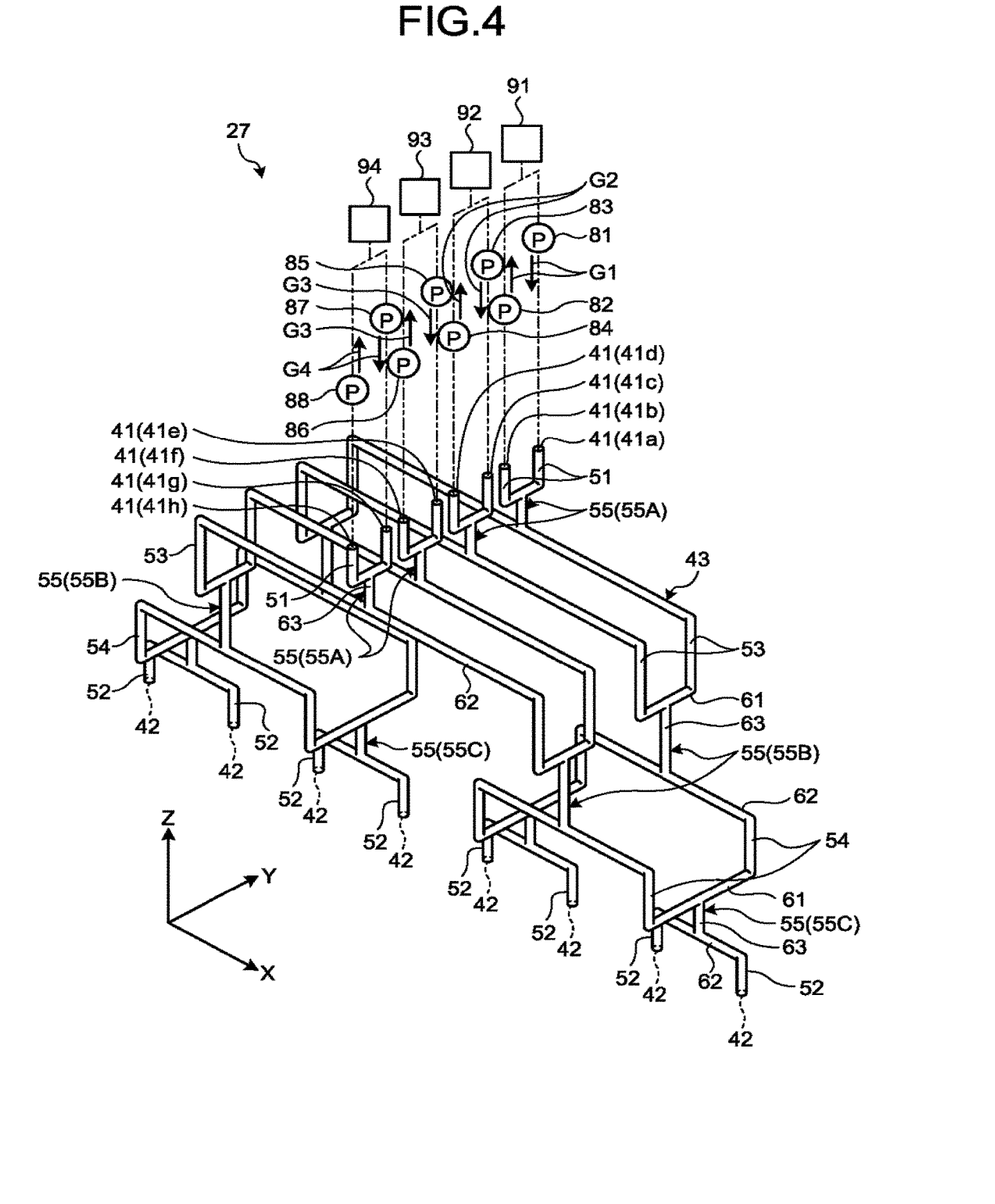
FIG. 4 is a perspective view schematically illustrating a shower plate according to a second embodiment.

Referring to FIG. 4, a second embodiment will now be described. In the following description of the embodiment, the components having similar functions as the components previously described are denoted with the same reference signs as the previously mentioned components, and an additional description may be omitted. A plurality of components denoted by the same reference sign may not necessarily be common in all of functions and properties and may have different functions and properties according to embodiments.

FIG. 4 is a perspective view schematically illustrating a shower plate 27 according to the second embodiment. As illustrated in FIG. 4, a semiconductor manufacturing apparatus 10 of the second embodiment includes a first pump 81, a second pump 82, a third pump 83, a fourth pump 84, a fifth pump 85, a sixth pump 86, a seventh pump 87, an eighth pump 88, a first tank 91, a second tank 92, a third tank 93, and a fourth tank 94. The first to eighth pumps 81 to 88 are an example of the feeder.

The first pump 81 is connected with one first opening 41a and connected with the first tank 91. The second pump 82 is connected with one first opening 41b and connected with the first tank 91.

The first tank 91 stores first gas G1. The first pump 81 is actuated to introduce the first gas G1 stored in the first tank 91 to the first opening 41a. The second pump 82 is actuated to suck fluid from the first opening 41b toward the first tank 91.

The third pump 83 is connected with one first opening 41c and connected with the second tank 92. The fourth pump 84 is connected with one first opening 41d and connected with the second tank 92.

The second tank 92 stores second gas G2. The third pump 83 is actuated to introduce the second gas G2 stored in the second tank 92 to the first opening 41c. The fourth pump 84 is actuated to suck fluid from the first opening 41d toward the second tank 92.

The fifth pump 85 is connected with one first opening 41e and connected with the third tank 93. The sixth pump 86 is connected with one first opening 41f and connected with the third tank 93.

The third tank 93 stores third gas G3. The fifth pump 85 is actuated to introduce the third gas G3 stored in the third tank 93 to the first opening 41e. The sixth pump 86 is actuated to suck fluid from the first opening 41f toward the third tank 93.

The seventh pump 87 is connected with one first opening 41g and connected with the fourth tank 94. The eighth pump 88 is connected with one first opening 41h and connected with the fourth tank 94.

The fourth tank 94 stores fourth gas G4. The seventh pump 87 is actuated to introduce the fourth gas G4 stored in the fourth tank 94 to the first opening 41g. The eighth pump 88 is actuated to suck fluid from the first opening 41h toward the fourth tank 94.

The first to fourth gases G1 to G4 have components different from each other. The first to fourth gases G1 to G4 are not limited to this, and at least two of the first to forth gases G1 to G4 may have a component common to each other.

As described above, the first, third, fifth, and seventh pumps 81, 83, 85, and 87 can introduce the first to fourth gases G1 to G4 individually to a plurality of first openings 41a, 41c, 41e, and 41g. The second, fourth, sixth, and eighth pumps 82, 84, 86, and 88 can suck fluid individually from a plurality of openings 41b, 41d, 41f, and 41h.

The aforementioned semiconductor manufacturing apparatus 10 ejects the first to fourth gases G1 to G4 toward the wafer W on the stage 25, for example, as will be described below. A method by which the semiconductor manufacturing apparatus 10 ejects the first to fourth gasses G1 to G4 is not limited to the method described below.

First, the semiconductor manufacturing apparatus 10 actuates the first pump 81. The first pump 81 introduces the first gas G1 stored in the first tank 91 to the first opening 41a. At this moment, the second to eighth pumps 82 to 88 are stopped.

The first gas G1 introduced to the first opening 41a flows from the first connecting passage 51 connected to the first opening 41a into the first part 61 of the joining and branching part 55A. The first gas G1 flows from the first coupling end 61b of the first part 61 into the connecting part 63. The first gas G1 branches at the second coupling ends 62b of the second parts 62 connected with each other. Similarly, the first gas G1 branches at the joining and branching parts 55B, 55C and is ejected from a plurality of second openings 42 toward the wafer W supported on the support 25a of the stage 25.

Next, the semiconductor manufacturing apparatus 10 stops the first pump 81 and actuates the second pump 82. The second pump 82 sucks fluid from the first opening 41b toward the first tank 91. The first gas G1 supplied to the chamber 21 is thus sucked from a plurality of second openings 42. The first gas G1 sucked from a plurality of second openings 42 merges at the joining and branching parts 55C, 55B, 55A and is recovered into the first tank 91 through the first opening 41b.

Next, the semiconductor manufacturing apparatus 10 stops the second pump 82 and actuates the third pump 83. The third pump 83 introduces the second gas G2 stored in the second tank 92 to the first opening 41c. At this moment, the first and second pumps 81, 82 and the fourth to eighth pumps 84 to 88 are stopped. The second gas G2 introduced to the first opening 41c branches at the joining and branching parts 55A, 55B, and 55C and is ejected from a plurality of second openings 42 toward the wafer W supported on the support 25a of the stage 25, in the same manner as the first gas G1.

Next, the semiconductor manufacturing apparatus 10 stops the third pump 83 and actuates the fourth pump 84. The fourth pump 84 sucks fluid from the first opening 41d toward the second tank 92. The second gas G2 supplied to the chamber 21 is thus sucked from a plurality of second openings 42. The second gas G2 sucked from a plurality of second openings 42 merges at the joining and branching parts 55C, 55B, and 55A and is recovered to the second tank 92 through the first opening 41d.

The semiconductor manufacturing apparatus 10 similarly allows the fifth and seventh pumps 85 and 87 to eject the third and fourth gases G3 and G4 through a plurality of second openings 42 and allows the sixth and eighth pumps 86 and 88 to suck the third and fourth gases G3 and G4 through the second openings 42.

The semiconductor manufacturing apparatus 10 may eject the first to fourth gases G1 to G4 individually from a plurality of second openings 42 as described above or may eject the gases mixed at the joining and branching parts 55 from a plurality of second openings 42. For example, the semiconductor manufacturing apparatus 10 may actuate the first pump 81 and the third pump 83 simultaneously. In this case, the first gas G1 and the second gas G2 are mixed at plurality of joining and branching parts 55, and a mixture of the first and second gasses G1 and G2 is ejected from a plurality of second openings 42.

In the semiconductor manufacturing apparatus 10 in the second embodiment, the first, third, fifth, and seventh pumps 81, 83, 85 and 87 can introduce any one of the first to fourth gasses G1 to G4 to one first opening 41 and introduce another one of the first to fourth gasses G1 to G4 to another first opening 41. In this case, the first to fourth gasses G1 to G4 are mixed at a plurality of joining and branching parts 55 provided in the flow passage 43, and at least two of the first to fourth gasses G1 to G4 evenly mixed are evenly ejected from a plurality of second openings 42. In this way, a plurality of gases (at least two of the first to fourth gasses G1 to G4) can be uniformly mixed in the flow passage 43.

The first to eighth pumps 81 to 88 are capable of at least one of: introduction of any one of the first to fourth gasses G1 to G4 to the first openings 41 individually; and suction of any one of the first to fourth gasses G1 to G4 from a plurality of first openings 41 individually. Thus, for example, by changing the number of the first to eighth pumps 81 to 88 actuated, the first to fourth gasses G1 to G4 can be introduced or sucked at desired pressure, flow rate, and proportion. When different kinds of gasses (the first to fourth gasses G1 to G4) are introduced from the first openings 41, a mixture of different kinds of gasses can be ejected or sucked from the same second opening 42.

According to at least one of the embodiments described above, the flow passage includes a plurality of joining and branching parts each having a plurality of first parts each having first ends connected with each other and a plurality of second parts each having second ends connected with each other, each first end being connected with the second ends. This configuration facilitates evenness of the pressure and the flow rate of fluid sucked or delivered from the first or second openings.

Although some embodiments of the present invention have been illustrated above, those embodiments are provided only by way of example and are not intended to limit the scope of the invention. These novel embodiments can be carried out in other various modes and are susceptible to various omissions, replacements, and changes without departing from the spirit of the invention. These embodiments and modifications thereof are embraced in the scope and spirit of the invention and embraced in the scope of the invention recited in the claims and equivalents thereto.

The invention claimed is:

1. A flow passage structure comprising:
   a member provided with:
      a plurality of first openings;
      a plurality of second openings;
      a flow passage connecting the plurality of first openings with the plurality of second openings; and
      a plurality of joining and branching parts provided in the flow passage, the plurality of joining and branching parts each including a plurality of first parts and a plurality of second parts, the plurality of first parts having respective first coupling ends connected with each other and respective first outer ends opposite to the first coupling ends, the plurality of second parts having respective second coupling ends connected with each other and respective second outer ends opposite to the second coupling ends, the plurality of second parts being closer to the plurality of second openings than the plurality of first parts are to the plurality of second openings in each of paths between the plurality of first openings and each of the plurality of second openings in the flow passage, the first coupling ends being connected with the second coupling ends in each of the plurality of joining and branching parts, wherein
   two or more of the plurality of joining and branching parts are provided in each of the paths between the plurality of first openings and each of the plurality of second openings in the flow passage, and
   each of the first outer ends of the plurality of first parts of one of the plurality of joining and branching parts is connected with one of the second outer ends of another one of the plurality of joining and branching parts.

2. The flow passage structure according to claim 1, wherein the paths between the plurality of first openings and each of the plurality of second openings in the flow passage have a uniform length.

3. The flow passage structure according to claim 1, wherein the plurality of first openings and the plurality of second openings are same in number.

4. The flow passage structure according to claim 3, wherein a same number of the joining and branching parts is provided in each of the paths between the plurality of first openings and each of the plurality of second openings in the flow passage.

5. The flow passage structure according to claim 1, wherein the flow passage connects each of the plurality of first openings with all of the plurality of second openings.

6. The flow passage structure according to claim 1, wherein the plurality of first parts are skew to the plurality of second parts in at least one of the plurality of joining and branching parts.

7. The flow passage structure according to claim 1 further comprising:
   a first face in which the plurality of first openings are formed; and
   a second face in which the plurality of second openings are formed.

8. The flow passage structure according to claim 1, wherein the plurality of joining and branching parts includes a plurality of first joining and branching parts and a second joining and branching part, each of the plurality of first joining and branching parts including two or more of the plurality of first parts and two or more of the plurality of second parts, the second joining and branching part including two or more of the plurality of first parts and two or more of the plurality of second parts, one of the plurality of first parts of the second joining and branching part is connected with one of the plurality of second parts of one of the plurality of first joining and branching parts, and another one of the plurality of first parts of the second joining and branching part is connected with one of the plurality of second parts of another one of the plurality of first joining and branching parts.

9. The flow passage structure according to claim 1, wherein
each of the plurality of joining and branching parts includes a connecting part,
the first coupling ends connected with each other are connected with the connecting part to extend from the connecting part, and
the second coupling ends connected with each other are connected with the connecting part to extend from the connecting part.

10. An intake and exhaust member comprising:
a member that is connectable to a feeder capable of at least one of delivery and suction of fluid and is provided with:
a plurality of first openings;
a plurality of second openings;
a flow passage connecting the plurality of first openings with the plurality of second openings; and
a plurality of joining and branching parts provided in the flow passage, the plurality of joining and branching parts each including a plurality of first parts and a plurality of second parts, the plurality of first parts having respective first coupling ends connected with each other and respective first outer ends opposite to the first coupling ends, the plurality of second parts having respective second coupling ends connected with each other and respective second outer ends opposite to the second coupling ends, the plurality of second parts being closer to the plurality of second openings than the plurality of first parts are to the plurality of second openings in each of paths between the plurality of first openings and each of the plurality of second openings in the flow passage, the first coupling ends being connected with the second coupling ends in each of the plurality of joining and branching parts, wherein
two or more of the plurality of joining and branching parts are provided in each of the paths between the plurality of first openings and each of the plurality of second openings in the flow passage, and
each of the first outer ends of the plurality of first parts of one of the plurality of joining and branching parts is connected with one of the second outer ends of another one of the plurality of joining and branching parts.

11. The intake and exhaust member according to claim 10, wherein the plurality of first parts are skew to the plurality of second parts in at least one of the plurality of joining and branching parts.

12. The intake and exhaust member according to claim 10, wherein
the plurality of joining and branching parts includes a plurality of first joining and branching parts and a second joining and branching part, each of the plurality of first joining and branching parts including two or more of the plurality of first parts and two or more of the plurality of second parts, the second joining and branching part including two or more of the plurality of first parts and two or more of the plurality of second parts, one of the plurality of first parts of the second joining and branching part is connected with one of the plurality of second parts of one of the plurality of first joining and branching parts, and another one of the plurality of first parts of the second joining and branching part is connected with one of the plurality of second parts of another one of the plurality of first joining and branching parts.

13. The intake and exhaust member according to claim 10, wherein
each of the plurality of joining and branching parts includes a connecting part,
the first coupling ends connected with each other are connected with the connecting part to extend from the connecting part, and
the second coupling ends connected with each other are connected with the connecting part to extend from the connecting part.

14. A processing apparatus comprising:
a support that supports an object;
a member provided with:
a plurality of first openings,
a plurality of second openings facing the support,
a flow passage connecting the plurality of first openings with the plurality of second openings, and
a plurality of joining and branching parts provided in the flow passage, the plurality of joining and branching parts each including a plurality of first parts and a plurality of second parts, the plurality of first parts having respective first coupling ends connected with each other and respective first outer ends opposite to the first coupling ends, the plurality of second parts having respective second coupling ends connected with each other and respective second outer ends opposite to the second coupling ends, the plurality of second parts being closer to the plurality of second openings than the plurality of first parts are to the plurality of second openings in each of paths between the plurality of first openings and each of the plurality of second openings in the flow passage, the first coupling ends being connected with the second coupling ends in each of the plurality of joining and branching parts; and
a feeder connected to the member, the feeder being capable of at least one of: introduction of fluid to the plurality of first openings; and suction of fluid from the plurality of first openings, wherein
two or more of the plurality of joining and branching parts are provided in each of the paths between the plurality of first openings and each of the plurality of second openings in the flow passage, and
each of the first outer ends of the plurality of first parts of one of the plurality of joining and branching parts is connected with one of the second outer ends of another one of the plurality of joining and branching parts.

15. The processing apparatus according to claim 14, wherein the feeder is capable of introducing first fluid to at least one of the plurality of first openings and introducing second fluid different from the first fluid to at least another one of the plurality of first openings.

16. The processing apparatus according to claim 14, wherein the feeder is capable of at least one of: introduction of fluid to the plurality of first openings individually; and suction of fluid from the plurality of first openings individually.

17. The processing apparatus according to claim 14, wherein the plurality of first parts are skew to the plurality of second parts in at least one of the plurality of joining and branching parts.

18. The processing apparatus according to claim 14, wherein the plurality of joining and branching parts including a plurality of first joining and branching parts and a second joining and branching part, each of the plurality of first joining and branching parts including two or more of the plurality of first parts and two or more of the plurality of second parts, the second joining and branching part including two or more of the plurality of first parts and two or more of the plurality of second parts, one of the plurality of first parts of the second joining and branching part is connected with one of the plurality of second parts of one of the plurality of first joining and branching parts, and another one of the plurality of first parts of the second joining and branching part is connected with one of the plurality of second parts of another one of the plurality of first joining and branching parts.

19. The processing apparatus according to claim 14, wherein each of the plurality of joining and branching parts includes a connecting part, the first coupling ends connected with each other are connected with the connecting part to extend from the connecting part, and the second coupling ends connected with each other are connected with the connecting part to extend from the connecting part.

* * * * *